United States Patent
Takenouchi (10) Patent No.: US 10,403,519 B2
(45) Date of Patent: *Sep. 3, 2019

(54) CUTTING BLADE HAVING CUTTING EDGE CONTAINING PHOTOCATALYST PARTICLES

(71) Applicant: DISCO CORPORATION, Tokyo (JP)

(72) Inventor: Kenji Takenouchi, Tokyo (JP)

(73) Assignee: Disco Corporation, Tokyo (JP)

( * ) Notice: Subject to any disclaimer, the term of this patent is extended or adjusted under 35 U.S.C. 154(b) by 97 days.

This patent is subject to a terminal disclaimer.

(21) Appl. No.: 15/004,492

(22) Filed: Jan. 22, 2016

(65) Prior Publication Data

US 2016/0218023 A1    Jul. 28, 2016

(30) Foreign Application Priority Data

Jan. 27, 2015    (JP) .................................. 2015-013151

(51) Int. Cl.
*B28D 5/02*    (2006.01)
*B28D 7/02*    (2006.01)
*H01L 21/67*    (2006.01)

(52) U.S. Cl.
CPC ........ *H01L 21/67092* (2013.01); *B28D 5/022* (2013.01); *B28D 7/02* (2013.01)

(58) Field of Classification Search
CPC .......... B28D 5/022; B28D 1/121; B24D 5/12; B24D 3/28; B24D 3/06; B24D 18/00; H01L 21/78; H01L 21/67092
USPC ..... 30/350, 346.53; 51/309, 295; 125/13.01, 125/15
See application file for complete search history.

(56) References Cited

U.S. PATENT DOCUMENTS

| | | | |
|---|---|---|---|
| 3,916,584 A * | 11/1975 | Howard | C04B 35/78 51/295 |
| 4,016,855 A | 4/1977 | Mimata | |
| 4,787,362 A * | 11/1988 | Boucher | B23D 61/028 125/15 |
| 5,718,615 A * | 2/1998 | Boucher | B23D 59/002 125/13.01 |
| 6,010,396 A * | 1/2000 | Ohmiya | B23D 59/001 451/446 |
| 6,105,567 A | 8/2000 | Sun et al. | |

(Continued)

FOREIGN PATENT DOCUMENTS

JP    2001-144034    5/2001
JP    2001144034 A    5/2001

(Continued)

OTHER PUBLICATIONS

U.S. Appl. No. 15/051,241, filed Feb. 23, 2016.

*Primary Examiner* — Laura M Lee
(74) *Attorney, Agent, or Firm* — Greer Burns & Crain, Ltd.

(57) ABSTRACT

A cutting blade for cutting a workpiece includes a base and a cutting edge fixed to a peripheral portion of the base. The cutting edge is formed by bonding a mixture of abrasive grains and photocatalyst particles with a binder. In cutting the workpiece by using the cutting blade, a cutting water is supplied to the cutting blade and light is applied to the cutting blade to excite the photocatalyst particles. The cutting water supplied to the cutting blade comes into contact with the photocatalyst particles excited, so that the cutting water is given an oxidizing power due to hydroxy radicals.

4 Claims, 6 Drawing Sheets

(56) References Cited

U.S. PATENT DOCUMENTS

| | | | | |
|---|---|---|---|---|
| 6,357,330 B1* | 3/2002 | Dass | ................... | B23D 59/001 |
| | | | | 125/13.01 |
| 7,029,374 B2* | 4/2006 | Chen | ................... | B08B 7/0035 |
| | | | | 134/1.3 |
| 2002/0019199 A1* | 2/2002 | Goers | ................... | B24B 7/241 |
| | | | | 451/41 |
| 2005/0106782 A1* | 5/2005 | Genda | ................... | B23K 26/18 |
| | | | | 438/118 |
| 2005/0277270 A1* | 12/2005 | Yoshikawa | ............ | B23K 26/16 |
| | | | | 438/463 |
| 2006/0062675 A1* | 3/2006 | Chiu | ........................ | B26B 9/00 |
| | | | | 416/241 B |
| 2008/0210066 A1 | 9/2008 | Arterburn et al. | | |
| 2011/0124181 A1 | 5/2011 | Suzuke et al. | | |
| 2014/0208659 A1* | 7/2014 | Sottke | ................... | C23C 16/308 |
| | | | | 51/295 |
| 2014/0359965 A1 | 12/2014 | Hansen et al. | | |
| 2015/0105006 A1* | 4/2015 | Beaucage | ................ | B24D 5/12 |
| | | | | 451/541 |
| 2015/0367529 A1 | 12/2015 | Wang et al. | | |

FOREIGN PATENT DOCUMENTS

| | | |
|---|---|---|
| JP | 2008-004822 | 1/2008 |
| JP | 2008004822 A | 1/2008 |

\* cited by examiner

FIG.8

CUTTING BLADE HAVING CUTTING EDGE CONTAINING PHOTOCATALYST PARTICLES

BACKGROUND OF THE INVENTION

Field of the Invention

The present invention relates to a cutting blade for cutting a workpiece, a cutting apparatus including the cutting blade, and a wafer processing method using the cutting apparatus.

Description of the Related Art

A plurality of devices such as ICs and LSIs are formed on the front side of a wafer so as to be separated by a plurality of division lines (streets). The wafer thus having the devices is divided along the division lines into individual device chips by using a cutting apparatus including a rotatable cutting blade. The device chips are used in various electronic equipment. To increase the speed of processing by the ICs and LSIs, the resistance or capacitance of wiring in each device must be reduced. This is due to the fact that a signal delay having a large effect on a processing speed is determined by the product of resistance and capacitance. In a wafer put in a practical use, low-permittivity insulator layers and metal foil layers are alternately stacked on the upper surface of a semiconductor substrate such as a silicon substrate. Each low-permittivity insulator layer is formed from an inorganic film such as SiOF film (fluorine-doped silicon oxide film) and BSG film or an organic film such as a polymer film of polyimide or parylene. Each metal foil layer is formed of copper, aluminum, etc. The front side of such a wafer is also partitioned by division lines to form a plurality of devices.

Such a stack composed of the low-permittivity insulator layers and the metal foil layers is called a low-k film because it has a low relative permittivity k. The low-k film is formed not only on the surface of each device, but also on the surface of each street. Since the number of interlayer spacings in the low-k film is large, the low-k film is very brittle and it is prone to separate from the surface of each device like mica. Accordingly, when each street is cut by using a cutting blade, there is a possibility of delamination of the low-k film in the range from each street to the adjacent devices due to the ductility of the metal forming the metal foil layers, causing a remarkable reduction in quality of each device. As a method for preventing such delamination reaching the adjacent devices, there has been proposed a method including the steps of applying a laser beam along each street to thereby remove the low-k film present on each street and next cutting a semiconductor substrate exposed along each street by using a cutting blade (see Japanese Patent Laid-open No. 2008-4822, for example).

SUMMARY OF THE INVENTION

However, in the above method described in Japanese Patent Laid-open No. 2008-4822, there is a problem that thermal strain is left in the semiconductor substrate by the application of the laser beam, causing a reduction in die strength of each device. Further, also in the case of cutting a wafer having a metal film called TEG (Test Element Group) on each street, there is a problem that when each street is cut by a cutting blade, burrs may be generated due to the ductility of the metal or the TEG may be separated, causing a reduction in quality of each device.

In addition, in the case of cutting a hard-to-cut material such as a gallium nitride (GaN) substrate and a silicon carbide (SiC) substrate by using a cutting blade, there is a problem that cracks may be generated so as to extend from each street to the adjacent devices or the surface of each device may be separated. Accordingly, it is difficult to cut such a hard-to-cut material by using a cutting blade.

It is therefore an object of the present invention to provide a cutting blade which can be used in cutting a wafer having a low-k film or TEG formed on each street or a hard-to-cut material such as a GaN substrate and a SiC substrate without any previous processing by a laser beam or the like along each street, thereby preventing a reduction in quality and die strength of each device.

It is another object of the present invention to provide a cutting apparatus including the cutting blade.

It is a further object of the present invention to provide a wafer processing method using the cutting apparatus.

In accordance with a first aspect of the present invention, there is provided a cutting blade for cutting a workpiece, including a base; and a cutting edge fixed to a peripheral portion of the base, the cutting edge being formed by bonding a mixture of abrasive grains and photocatalyst particles with a binder. Preferably, the abrasive grains are diamond grains, and the photocatalyst particles are titanium oxide ($TiO_2$) particles.

In accordance with a second aspect of the present invention, there is provided a cutting blade for cutting a workpiece, the cutting blade being a washer type, including only an annular abrasive member formed by bonding a mixture of abrasive grains and photocatalyst particles with a binder. Preferably, the abrasive grains are diamond grains, and the photocatalyst particles are titanium oxide ($TiO_2$) particles.

In accordance with a third aspect of the present invention, there is provided a wafer processing method including a wafer holding step of holding a wafer on a chuck table; a cutting step of feeding a cutting blade rotating at a high speed to cut in the wafer, the cutting blade containing photocatalyst particles, and relatively moving the chuck table and the cutting blade as supplying a cutting water to the cutting blade, thereby cutting the wafer; and a light applying step of applying light to the cutting blade to thereby excite the photocatalyst particles in the cutting step; whereby the cutting water supplied to the cutting blade is brought into contact with the photocatalyst particles excited to thereby give the cutting water an oxidizing power due to hydroxy radicals.

In accordance with a fourth aspect of the present invention, there is provided a cutting apparatus including a chuck table for holding a wafer; cutting means having a cutting blade for cutting the wafer held on the chuck table, the cutting blade having a cutting edge containing photocatalyst particles; and a cutting water nozzle for supplying a cutting water to the cutting blade; the cutting means including a spindle, the cutting blade detachably mounted on a front end portion of the spindle, and light applying means for applying light for exciting the photocatalyst particles; whereby when the light for exciting the photocatalyst particles is applied from the light applying means to the cutting edge of the cutting blade, the cutting water supplied from the cutting water nozzle to the cutting blade is given an oxidizing power due to hydroxy radicals.

The cutting blade according to the present invention has the peripheral cutting edge formed by bonding a mixture of abrasive grains and photocatalyst particles with a binder. Accordingly, in the case of cutting a wafer having a multi-layer low-k film or TEG on each street by using the cutting blade according to the present invention, the following effect can be attained. When light is applied to the cutting edge of the cutting blade in cutting the wafer as supplying a cutting water to the cutting blade, the photocatalyst particles contained in the cutting edge are excited by the light applied, and the cutting water supplied to the cutting blade comes into contact with the photocatalyst particles excited. As a result, an oxidizing power due to hydroxy radicals is given to the cutting water, thereby oxidizing the metal foil layers in the low-k film or the TEG present on each street. Accordingly, the wafer can be cut as blocking the ductility of the metal present in the range from each street to the adjacent devices, so that the delamination of the low-k film or the TEG from the surface of the wafer can be suppressed. Further, the generation of burrs can also be prevented.

Further, also in the case that the wafer to be cut is a GaN substrate or a SiC substrate, each street can be weakened by the strong oxidizing power in cutting the wafer by using the cutting blade, so that the wafer can be cut by the cutting blade. In the case that the abrasive grains are diamond grains and the photocatalyst particles are titanium oxide ($TiO_2$) particles, the titanium oxide particles can be excited by applying ultraviolet light to the cutting edge of the cutting blade. When the cutting water supplied to the cutting blade comes into contact with the titanium oxide particles excited, the strong oxidizing power due to hydroxy radicals can be given to the cutting water supplied to the cutting blade.

The wafer cutting method according to the present invention includes the cutting step of cutting the wafer by using the cutting blade, wherein the cutting water is supplied to the cutting blade and the light for exciting the photocatalyst particles is applied to the cutting edge of the cutting blade in cutting the wafer, so that the cutting water supplied to the cutting blade comes into contact with the photocatalyst particles excited. As a result, the cutting water is oxidized by the photocatalyst particles excited to produce hydroxy radicals, which function to oxidize the metal foil layers in the low-k film or the TEG formed on each street. Accordingly, the wafer can be cut as blocking the ductility of the metal present in the range from each street to the adjacent devices, so that the delamination of the low-k film or the TEG from the surface of the wafer can be suppressed. Further, the generation of burrs can also be prevented.

Further, the cutting means of the cutting apparatus according to the present invention includes the cutting blade and the light applying means for applying light for exciting the photocatalyst particles. Accordingly, when the light is applied to the cutting edge containing the photocatalyst particles, the photocatalyst particles are excited. When the cutting water supplied to the cutting blade comes into contact with the photocatalyst particles excited, the cutting water is given the oxidizing power due to hydroxy radicals. As a result, the metal foil layers in the low-k film or the TEG formed on each street can be oxidized. Accordingly, the wafer can be cut as blocking the ductility of the metal present on each street, so that the delamination of the low-k film or the TEG from the surface of the wafer can be suppressed. Further, the generation of burrs can also be prevented.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

First Preferred Embodiment of the Cutting Blade

Figure 1:
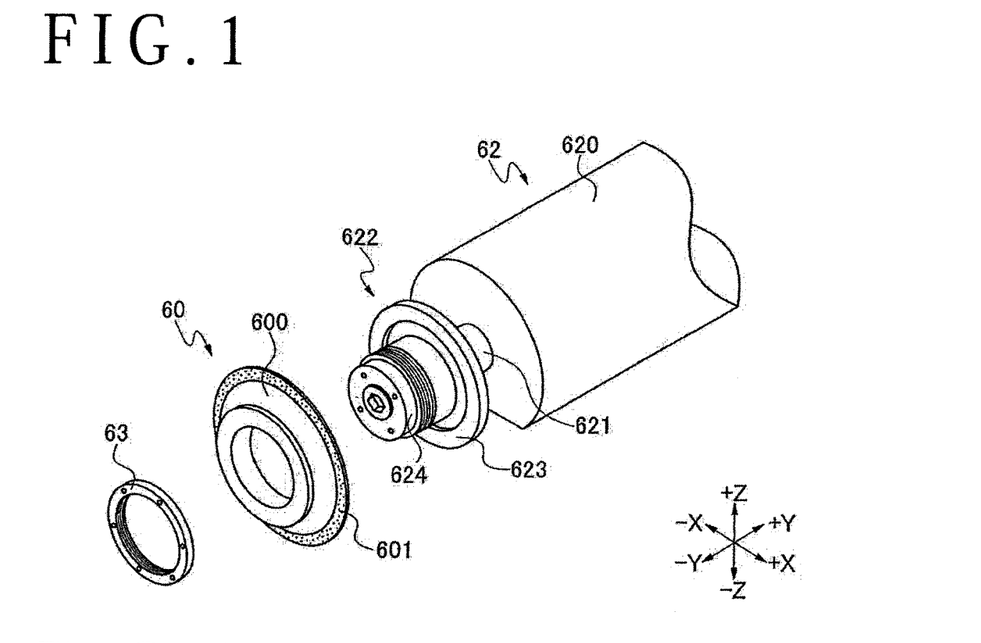
FIG. 1 is an exploded perspective view showing a manner of fixing a cutting blade according to a first preferred embodiment to a spindle.
Figure 2:
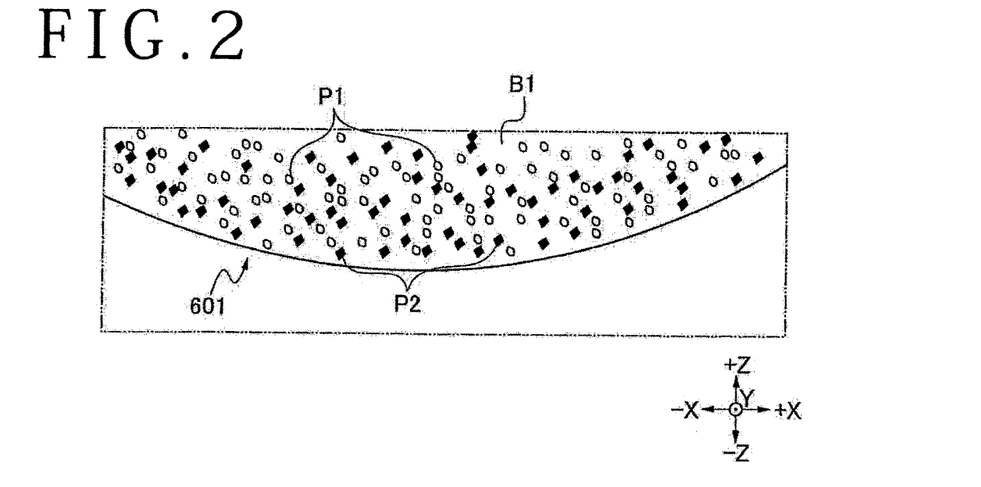
FIG. 2 is an enlarged elevational view showing a part of a cutting edge constituting the cutting blade shown in FIG. 1.

Referring to FIG. 1, a cutting blade 60 according to a first preferred embodiment of the present invention is shown. The cutting blade 60 is an electroformed hub blade, which is composed of a disk-shaped aluminum base (hub) 600 and an annular cutting edge 601 fixed to the peripheral portion of the base 600. As shown in FIG. 2, the cutting edge 601 is formed by mixing diamond abrasive grains P1 and titanium oxide particles P2 as photocatalyst particles and bonding this mixture with a nickel plating electroformed binder B1.

The cutting blade 60 is manufactured in the following manner, for example. First, the diamond abrasive grains P1 having a grain size of about 10 μm and the titanium oxide particles P2 having a particle size of about 10 μm are mixed into a nickel plating solution and then stirred, wherein the mixing ratio between the diamond abrasive grains P1 and the titanium oxide particles P2 is set to 30:40 in weight ratio. Thereafter, the disk-shaped aluminum base 600 having a diameter of about 50 mm and a nickel bar are immersed into the nickel plating solution containing the mixture of the diamond abrasive grains P1 and the titanium oxide particles P2. Further, an anode is connected to the nickel bar and a cathode is connected to the aluminum base 600. Thereafter, a predetermined voltage is applied between the anode and the cathode from an external power source. Accordingly, the nickel plating electroformed binder B1 is deposited together with the diamond abrasive grains P1 and the titanium oxide particles P2 as an electrodeposited layer to the surface of the base 600, wherein this electrodeposited layer is formed to have a predetermined thickness (e.g., about 50 μm in the first preferred embodiment). Thereafter, the base 600 is lifted from the nickel plating solution, and the peripheral portion of the base 600 is etched to project the cutting edge 601 having a thickness of about 50 μm and a width of about 0.5 to 2 mm. In this manner, the cutting blade 60 having the peripheral cutting edge 601 can be manufactured, wherein the cutting edge 601 is formed by bonding the mixture of the diamond abrasive grains P1 and the titanium oxide particles P2 with the nickel plating electroformed binder B1 as shown in FIG. 2. The weight ratio between the diamond abrasive grains P1 and the titanium oxide particles P2 may be suitably changed according to the kind of the titanium oxide particles P2, for example.

Referring to FIG. 1, a spindle unit 62 is also shown. The spindle unit 62 includes a spindle housing 620, a spindle 621 rotatably supported in the spindle housing 620 and having an axis extending in the direction (Y direction) perpendicular to the X direction in an XY plane (horizontal plane), and a mount flange 622 detachably mounted on the front end portion of the spindle 621. The mount flange 622 includes a flange portion 623 and a boss portion 624 projecting from the flange portion 623 in its thickness direction (Y direction), the boss portion 624 having an external thread on the outer circumferential surface. The cutting blade 60 has a central hole, through which the boss portion 624 of the mount flange 622 is inserted. After the boss portion 624 of the mount flange 622 is inserted through the central hole of the cutting blade 60, a nut 63 is threadedly engaged with the external thread of the boss portion 624, thereby tightly holding the cutting blade 60 between the nut 63 and the flange portion 623 of the mount flange 622 from the opposite sides in the Y direction. Thusly, the cutting blade 60 is fixed through the mount flange 622 to the spindle 621. The spindle 621 is rotationally driven by a motor (not shown) to thereby rotate the cutting blade 60 at a high speed.

Second Preferred Embodiment of the Cutting Blade

Figure 3:
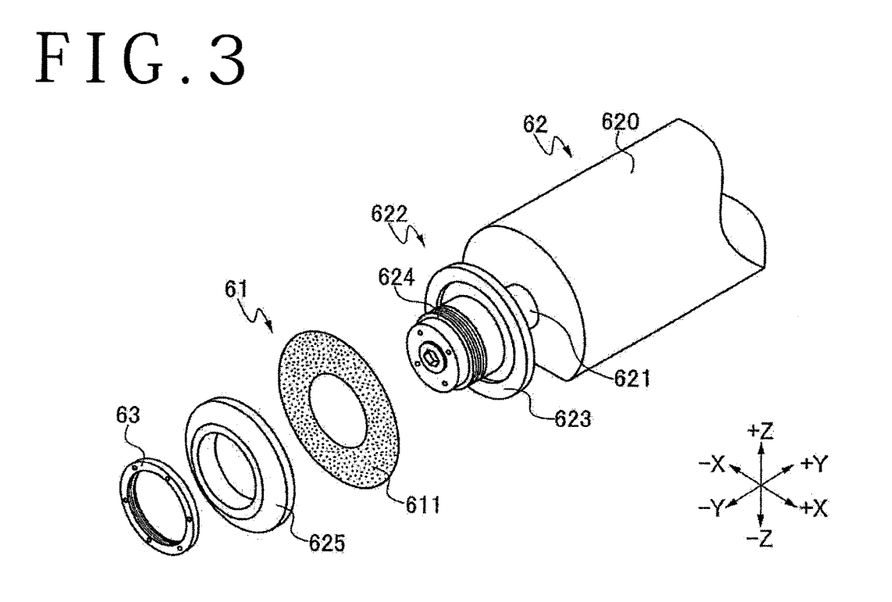
FIG. 3 is an exploded perspective view showing a manner of fixing a cutting blade according to a second preferred embodiment to the spindle.
Figure 4:
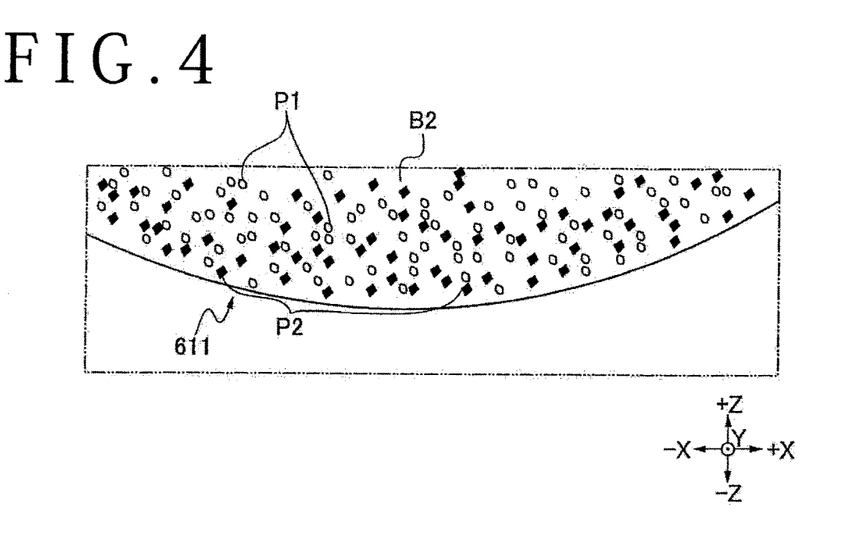
FIG. 4 is an enlarged elevational view showing a part of a cutting edge constituting the cutting blade shown in FIG. 3.

Referring to FIG. 3, a cutting blade 61 according to a second preferred embodiment of the present invention is shown. The cutting blade 61 is a washer type resin bond blade having an annular shape. That is, the cutting blade 61 is composed solely of an abrasive member (cutting edge) 611. As shown in FIG. 4, the abrasive member (cutting edge) 611 is formed by mixing diamond abrasive grains P1 and titanium oxide particles P2 as photocatalyst particles and forming this mixture with phenol resin to bond this mixture with a phenol resin binder B2.

The cutting blade 61 is manufactured in the following manner, for example. First, 30 parts by weight of the diamond abrasive grains P1 having a grain size of about 10 μm is mixed into 100 parts by weight of phenol resin forming the resin binder B2. Further, 40 parts by weight of the titanium oxide particles P2 having a particle size of about 10 μm is mixed into 100 parts by weight of this phenol resin and then stirred. Thereafter, this mixture is heated to about 160° C. and pressed for about 10 to 20 minutes to thereby form an annular member having a predetermined thickness (e.g., about 0.15 mm), a predetermined outer diameter (e.g., about 50 mm), and a predetermined inner diameter (e.g., about 40 mm). Thereafter, this annular member is sintered at 180° C. to 200° C. for several hours. In this manner, the cutting blade 61 composed solely of the abrasive member (cutting edge) 611 having a thickness of about 0.15 mm can be manufactured, wherein it is formed by bonding the mixture of the diamond abrasive grains P1 and the titanium oxide particles P2 with the phenol resin binder B2 as shown in FIG. 4. The weight ratio of the resin binder B2, the diamond abrasive grains P1, and the titanium oxide particles P2 may be suitably changed according to the kind of the titanium oxide particles P2, for example.

As shown in FIG. 3, the cutting blade 61 is fixed to the spindle 621 in the following manner. The cutting blade 61 has a central hole, through which the boss portion 624 of the mount flange 622 constituting the spindle unit 62 is inserted. After the boss portion 624 of the mount flange 622 is inserted through the central hole of the cutting blade 61, a detachable flange 625 having a central hole is fitted to the boss portion 624 in such a manner that the boss portion 624 is inserted through the central hole of the detachable flange 625. Thereafter, the nut 63 is threadedly engaged with the external thread of the boss portion 624, thereby tightly holding the cutting blade 61 between the flange portion 623 of the mount flange 622 and the detachable flange 625 from the opposite sides in the Y direction. Thusly, the cutting blade 61 is fixed through the mount flange 622 and the detachable flange 625 to the spindle 621. The spindle 621 is rotationally driven by a motor (not shown) to thereby rotate the cutting blade 61 at a high speed.

Figure 5:
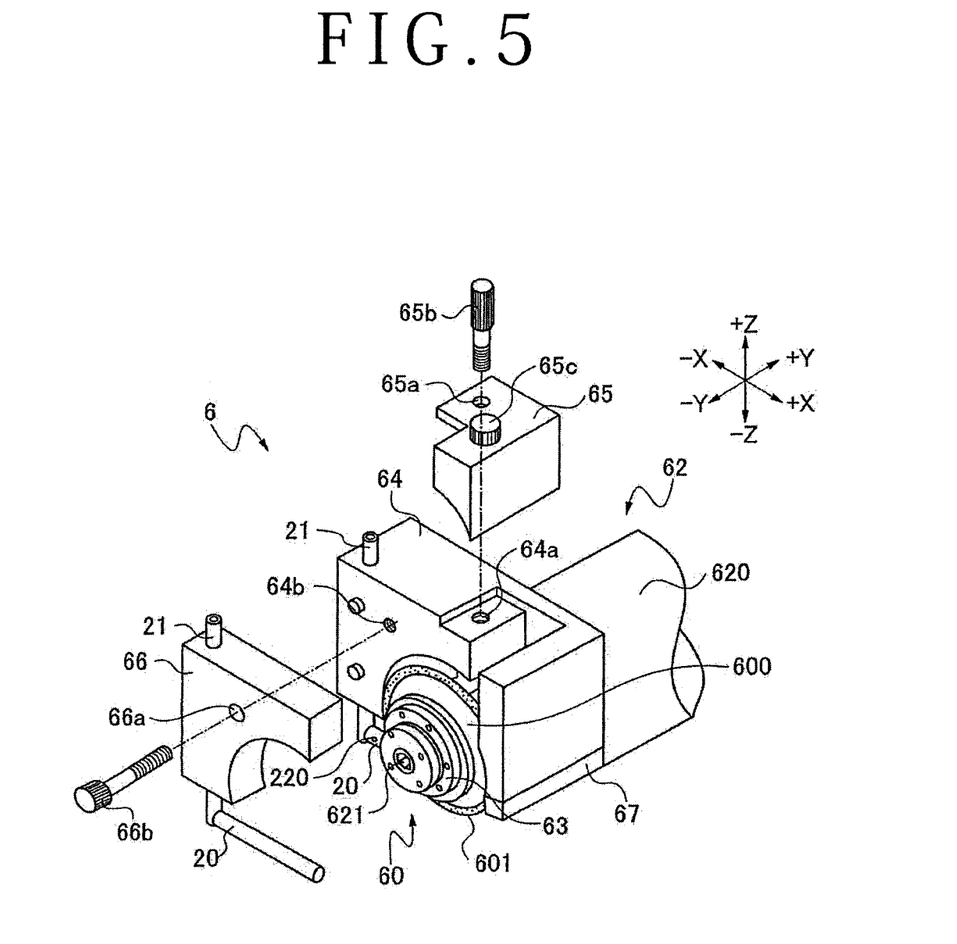
FIG. 5 is an exploded perspective view of cutting means including the cutting blade shown in FIG. 1.
Figure 6:
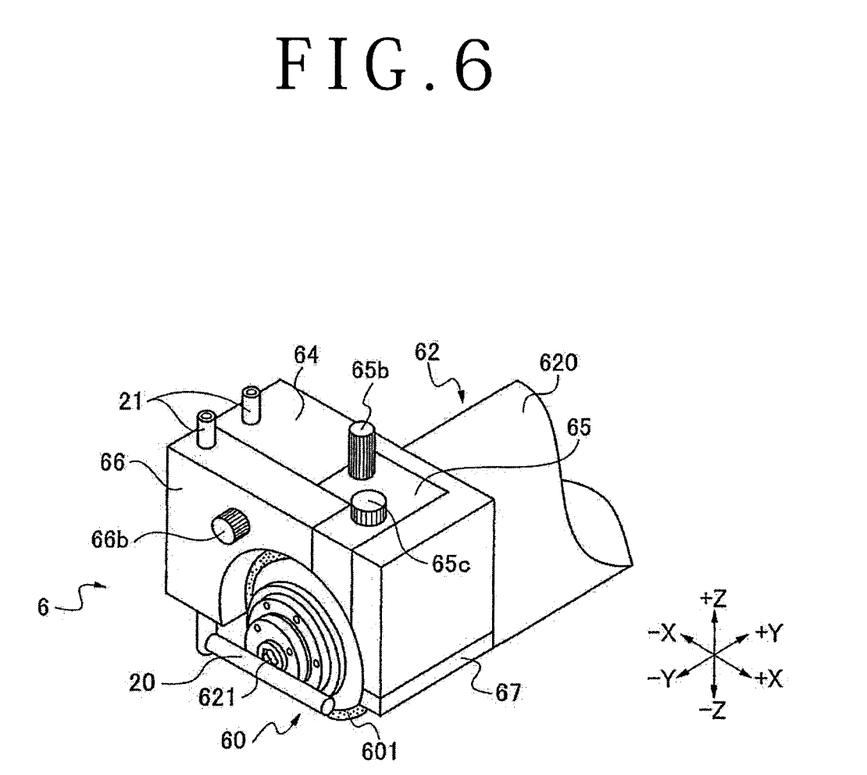
FIG. 6 is a perspective view of the cutting means shown in FIG. 5 in its assembled condition.

Referring to FIGS. 5 and 6, there is shown cutting means 6 including the spindle unit 62, the cutting blade 60 fixed to the spindle 621 of the spindle unit 62 according to the first preferred embodiment shown in FIG. 1, a blade cover 64 for covering the cutting blade 60, a blade detecting block 65 mounted on the blade cover 64, a detachable cover 66 mounted on the blade cover 64, and light applying means 67 mounted on the blade cover 64.

The blade cover 64 covers the cutting blade 60 so as to straddle it from the +Z side (the side shown by an arrow +Z) as viewed in the Y direction. The blade detecting block 65 is mounted to the blade cover 64 from the +Z side in such a manner that a screw 65b is inserted through a hole 65a formed in the blade detecting block 65 and threadedly engaged with a tapped hole 64a formed in the blade cover 64. The blade detecting block 65 is provided with a blade sensor (not shown) composed of a light emitting device and a photodetector. The position of the blade sensor in the Z direction is adjustable by an adjusting screw 65c. The condition of the cutting edge 601 of the cutting blade 60 is detected by this blade sensor.

The detachable cover 66 is mounted to the blade cover 64 from the −Y side (the side shown by an arrow −Y) in such a manner that a screw 66b is inserted through a hole 66a formed in the detachable cover 66 and threadedly engaged with a tapped hole 64b formed in the blade cover 64.

The light applying means 67 is provided by an ultraviolet lamp capable of applying ultraviolet light having a wavelength of about 280 to 380 nm. The light applying means 67 is detachably mounted on a lower portion of the blade cover 64 so as to be opposed to the cutting edge 601 from the +X side (the side shown by an arrow +X). In a wafer cutting step by the cutting blade 60, the light applying means 67 applies ultraviolet light to the cutting edge 601 of the cutting blade 60 to thereby excite the titanium oxide particles P2. The light applying means 67 is not limited to such an ultraviolet lamp for applying ultraviolet light, depending on the kind of the titanium oxide particles P2. For example, in the case that the titanium oxide particles P2 are nitrogen-doped titanium oxide particles which can develop photocatalytic activity by the irradiation of visible light, the light applying means 67 may be provided by a xenon lamp or fluorescent lamp capable of applying visible light having a wavelength of about 400 to 740 nm, for example. Further, the mounting position of the light applying means 67 is not limited to the lower portion of the blade cover 64, but it is preferably set to a position where ultraviolet light is directly applied to a cutting point of the cutting edge 601 to a wafer W (which will be hereinafter described) without dispersion.

Figure 8:
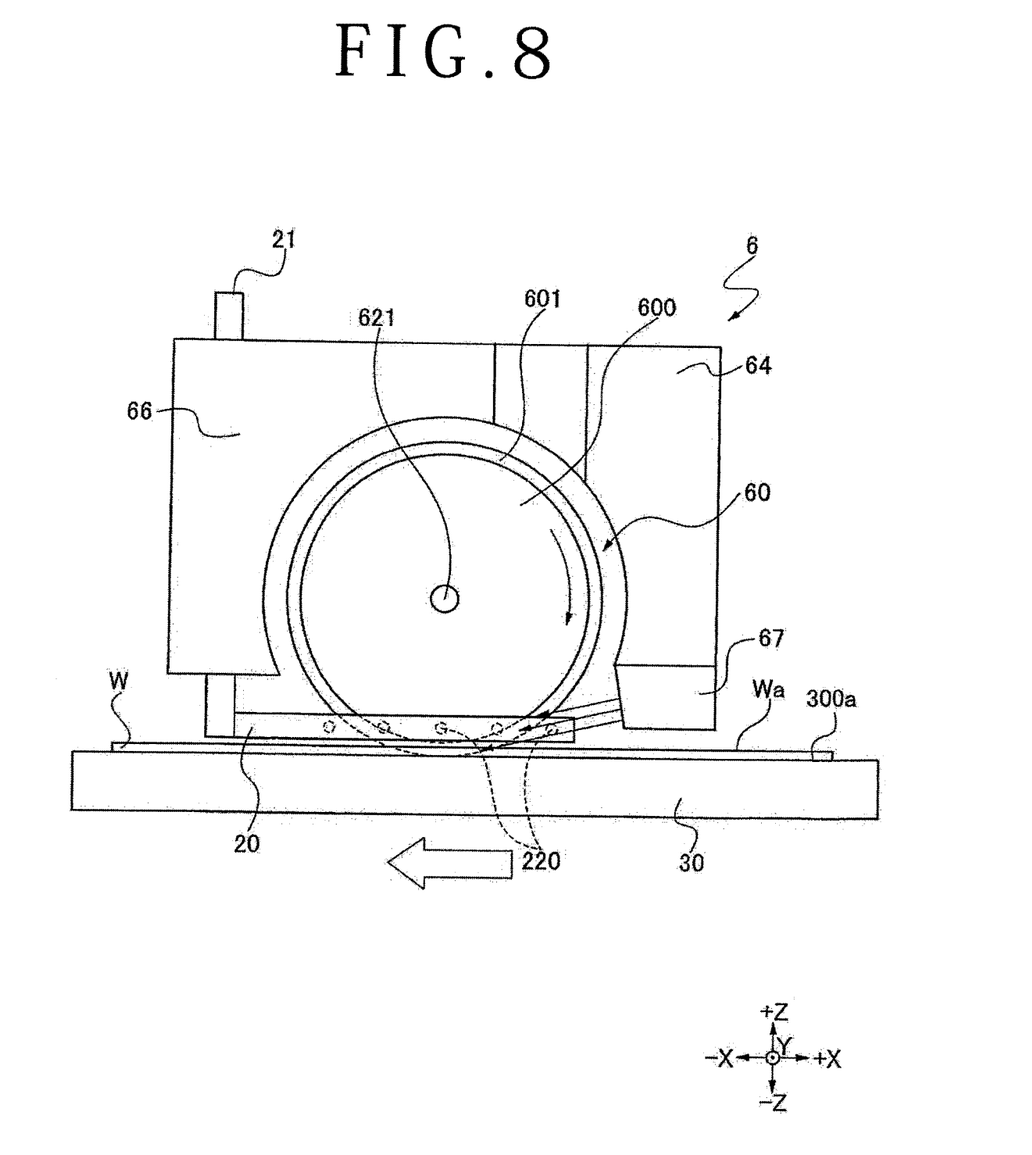
FIG. 8 is a schematic elevational view for illustrating a cutting step using the cutting apparatus shown in FIG. 7, wherein a chuck table holding a wafer is fed relative to the cutting blade being rotated.

Further, a pair of cutting water nozzles 20 for supplying a cutting water to the cutting blade 60 are provided on the opposite sides of the cutting blade 60 in the Y direction. The pair of cutting water nozzles 20 are respectively connected to a pair of cutting water inlets 21 for introducing a cutting water. The cutting water nozzle 20 and the cutting water inlet 21 on the +Y side (the side shown by an arrow +Y) are supported to the blade cover 64, whereas the cutting water nozzle 20 and the cutting water inlet 21 on the −Y side are supported to the detachable cover 66. These cutting water nozzles 20 extend in the X direction along the opposite side surfaces of the cutting blade 60. As best shown in FIG. 8, each cutting water nozzle 20 has a plurality of nozzle holes 220 for directing a cutting water to the cutting point of the cutting edge 601 to the wafer W. The plural nozzle holes 220 are arranged in line in the X direction so as to face each side surface of the cutting blade 60.

Figure 7:
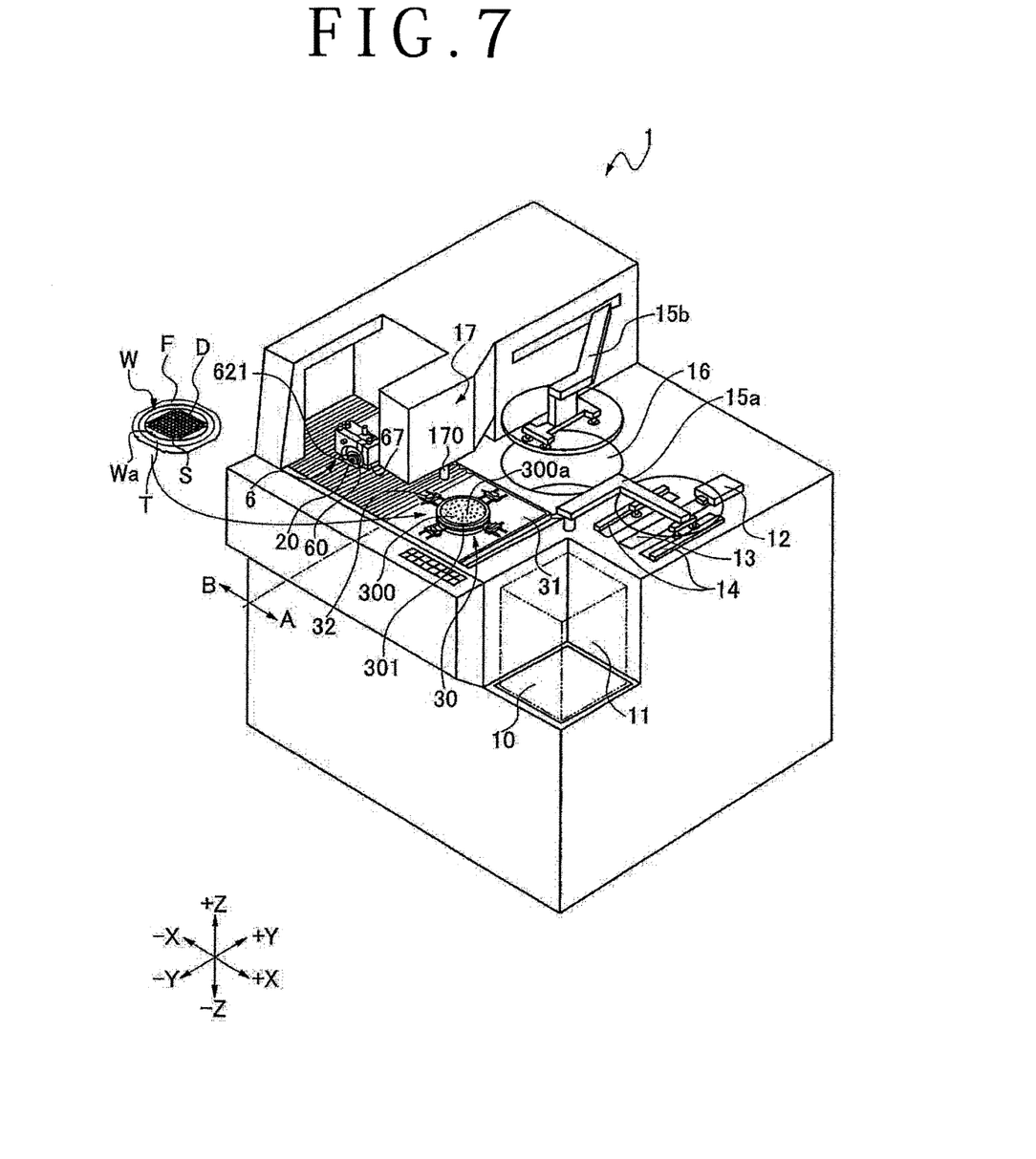
FIG. 7 is a perspective view of a cutting apparatus including the cutting means shown in FIG. 6.

Referring to FIG. 7, a cutting apparatus 1 including the cutting means 6 is shown, wherein the wafer W is cut by the cutting means 6. The wafer W is a semiconductor wafer, for example. The wafer W has an upper surface (front side) Wa and a lower surface (back side) (not shown). The wafer W is composed of a silicon substrate and a multilayer low-k film formed on the upper surface of the silicon substrate. Accordingly, the upper surface of the low-k film forms the upper surface Wa of the wafer W. The upper surface Wa of the wafer W is partitioned by a plurality of crossing streets S to define a plurality of separate regions where a plurality of devices D are formed. The lower surface of the wafer W is attached to the upper surface (adhesive surface) of a dicing tape T at its central portion. The peripheral portion of the dicing tape T is attached to an annular frame F. Accordingly, the wafer W is supported through the dicing tape T to the annular frame F. The shape and kind of the wafer W are not especially limited. Examples of the wafer W also include a wafer having a TEG on each street, a GaN substrate, and a SiC substrate.

The cutting apparatus 1 shown in FIG. 7 includes a chuck table 30 for holding the wafer W, wherein the wafer W held on the chuck table 30 is cut by the cutting means 6 shown in FIGS. 5 and 6. The chuck table 30 is movable in the X direction by X moving means (work feeding means) (not shown). The cutting means 6 is movable in the Y direction by Y moving means (indexing means) (not shown) and also movable in the Z direction by Z moving means (cutter feeding means) (not shown).

An elevating mechanism 10 for vertically moving a wafer cassette 11 in the Z direction is provided at a front end portion of the cutting apparatus 1, wherein the wafer cassette 11 is placed on the upper surface of the elevating mechanism 10. A plurality of wafers W each supported through the dicing tape T to the annular frame F are stored in the wafer cassette 11. Wafer handling means 12 is provided on the rear side (+Y side) of the wafer cassette 11 to take one of the wafers W out of the wafer cassette 11 before cutting or to return the wafer W into the wafer cassette 11 after cutting. A temporary placement area 13 for temporarily placing the wafer W before cutting or after cutting is provided between the wafer cassette 11 and the wafer handling means 12. In the temporary placement area 13, there is provided positioning means 14 for positioning the wafer W temporarily placed.

First transfer means 15a is provided in the vicinity of the temporary placement area 13 to transfer the wafer W between the chuck table 30 and the temporary placement area 13. The first transfer means 15a is so configured as to hold the wafer W under suction, whereby the wafer W to be cut is held under suction and then transferred from the temporary placement area 13 to the chuck table 30 by the first transfer means 15a.

Cleaning means 16 for cleaning the wafer W after cutting is provided in the vicinity of the first transfer means 15a. Further, there is provided above the cleaning means 16 second transfer means 15b for transferring the wafer W from the chuck table 30 to the cleaning means 16 after cutting. The second transfer means 15b is also configured so as to hold the wafer W under suction.

The chuck table 30 shown in FIG. 7 is circular in outside shape, and it includes a suction holding portion 300 for holding the wafer W under suction and a frame member 301 for supporting the suction holding portion 300. The suction holding portion 300 has a suction holding surface 300a as an exposed surface communicating with a vacuum source (not shown), wherein the wafer W is held on the suction holding surface 300a under suction. The chuck table 30 is rotatable about its axis extending in the Z direction and it is surrounded by a cover 31. Further, clamping means 32 for clamping the annular frame F is provided around the chuck table 30.

The chuck table 30 is reciprocatively movable in the X direction by the X moving means (not shown) provided under the cover 31, between a standby area A where the wafer W is held or upheld on the chuck table 30 before cutting or after cutting and a cutting area B where the wafer W is cut by the cutting means 6. There is provided above a moving path of the chuck table 30 alignment means 17 for detecting the streets S to be cut. The alignment means 17 includes imaging means 170 for imaging the upper surface Wa of the wafer W and can detect the streets S to be cut according to an image obtained by the imaging means 170. The cutting means 6 for cutting the wafer W held on the chuck table 30 is provided in the cutting area B in the vicinity of the alignment means 17. The cutting means 6 and the alignment means 17 are integrated and they are movable together in the Y direction and the Z direction.

There will now be described with reference to FIGS. 7 and 8 the operation of the cutting apparatus 1, the operation of the cutting means 6 including the cutting blade 60, and the cutting method for cutting the wafer W by using the cutting apparatus 1. In FIG. 8, the components of the cutting apparatus 1 shown in FIG. 7 and the components of the cutting means 6 shown in FIG. 6 are simply shown and the annular frame F and the dicing tape T shown in FIG. 7 are also omitted.

(1) Wafer Holding Step

Referring to FIG. 7, the wafer handling means 12 is operated to take one of the plural wafers W out of the wafer cassette 11 to the temporary placement area 13, wherein each wafer W is supported through the dicing tape T to the annular frame F. In the temporary placement area 13, the wafer W is positioned by operating the positioning means 14. Thereafter, the wafer W is held under suction by the first transfer means 15a and then transferred from the temporary placement area 13 to the suction holding surface 300a of the chuck table 30. Thereafter, the annular frame F is clamped by the clamping means 32, and the wafer W is held under suction on the suction holding surface 300a. Thus, the wafer W is held by the chuck table 30.

(2) Cutting Step

After performing the wafer holding step, a cutting step is performed to cut the wafer W held on the chuck table 30 by using the cutting means 6. In the cutting step, the X moving means (not shown) is operated to move the chuck table 30 holding the wafer W in the direction of the arrow −X. During the movement of the chuck table 30, the imaging means 170 is operated to image the upper surface Wa of the wafer W, thereby detecting the streets S to be cut. At the same time, the Y moving means (not shown) is operated to move the cutting means 6 in the Y direction, thereby aligning the cutting blade 60 with a target one of the streets S extending in a first direction.

After performing such alignment between the cutting blade 60 and the target street S to be cut, the X moving means (not shown) is operated again to further move the chuck table 30 holding the wafer W in the direction of the arrow −X at a feed speed of about 50 mm/second, for example, as shown in FIG. 8. At the same time, the Z moving means (not shown) is operated to lower the cutting means 6 in the direction of the arrow −Z. Further, the spindle 621 is rotated at a high speed of about 20000 rpm by the motor (not shown) to thereby rotate the cutting blade 60 fixed to the spindle 621 at the high speed. During this rotation, the cutting blade 60 is lowered to cut in the wafer W and is relatively fed along the target street S, thereby cutting the wafer W along the target street S. In cutting the wafer W, a cutting water is introduced from the water inlets 21 and directed from the nozzle holes 220 of the cutting water nozzles 20 shown in FIGS. 5 and 6 toward the cutting point where the cutting edge 601 of the cutting blade 60 comes into contact with the target street S of the wafer W. The cutting water is supplied to the cutting blade 60 at a rate of 2000 cc/minute, for example.

Further, as shown in FIG. 8, the light applying means 67 is operated in the cutting step to apply ultraviolet light having a wavelength of about 365 nm to the cutting edge 601 of the cutting blade 60 rotating at a high speed. The ultraviolet light is applied during at least a period from the time just before the cutting edge 601 cuts into the target street S of the wafer W to the time when the cutting edge 601 separates from the wafer W. As a result, the titanium oxide particles P2 contained in the cutting edge 601 are excited by the ultraviolet light. That is, when the ultraviolet light is applied to the surface of the titanium oxide particles P2 contained in the cutting edge 601, the electron in the valence band of each titanium oxide particle P2 is excited to produce two carriers of electron and hole.

The cutting edge 601 comes into contact with the cutting water directed from the cutting water nozzles 20 at least on the target street S of the wafer W, so that the hole produced from each titanium oxide particle P2 contained in the cutting edge 601 operates to oxidize the cutting water present on the surface of each titanium oxide particle P2, thereby producing hydroxy radicals having a high oxidizing power. Accordingly, the oxidizing power of the hydroxy radicals is given to the cutting water directed from the cutting water nozzles 20 at least on the target street S. As a result, the metal foil layers in the multilayer low-k film formed on each street S of the wafer W are oxidized by the hydroxy radicals produced, thereby blocking the ductility of the metal foil layers in the low-k film formed on the target street S between the adjacent devices D.

Thus, the cutting blade 60 can perform cutting of the wafer W in the condition where the ductility of the metal present on the target street S is blocked, so that the delamination of the low-k film occurring in the range from the target street S to the adjacent devices D can be suppressed. Further, chipping and the generation of burrs can also be prevented. Further, since the duration of presence of the hydroxy radicals produced is short, there is no possibility that the surface of each device D may be oxidized by the cutting water. The cutting water directed to the cutting blade 60 functions to cool the cutting point where the cutting edge 601 comes into contact with the wafer W and also to remove cutting dust generated at the cutting point.

When the chuck table 30 holding the wafer W is moved in the direction of the arrow −X to reach a predetermined position where the cutting of the target street S by the cutting blade 60 is finished, the movement of the chuck table 30 by the X moving means (not shown) is once stopped and the Z moving means (not shown) is next operated to raise the cutting blade 60 away from the wafer W. Thereafter, the X moving means (not shown) is operated to move the chuck table 30 in the direction of the arrow +X to return the chuck table 30 to the original position. Thereafter, the Y moving means (not shown) is operated to move (index) the cutting blade 60 by the pitch of the streets S and the above cutting operation is similarly performed to the next street S extending in the first direction. Such a series of operations is repeated for all the other streets S extending in the first direction. Thereafter, the chuck table 30 is rotated 90 degrees by operating any rotating means (not shown) to similarly perform the above cutting operation for all the streets S extending in a second direction perpendicular to the first direction. In this manner, all the crossing streets S extending in the first and second directions are cut by the cutting blade 60.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor wafer processing method comprising:
   a wafer holding step of holding a semiconductor wafer on a chuck table;
   a cutting step of feeding a cutting blade rotating at a predetermined speed to cut in said semiconductor wafer, said cutting blade containing photocatalyst particles, and relatively moving said chuck table and said cutting blade as supplying a cutting water to said cutting blade, thereby cutting said semiconductor wafer; and
   a light applying step of applying light to said cutting blade to thereby excite said photocatalyst particles in said cutting step,
   whereby said cutting water supplied to said cutting blade is brought into contact with said photocatalyst particles excited to thereby give said cutting water an oxidizing power due to hydroxy radicals.

2. The semiconductor wafer processing method according to claim 1, wherein said photocatalyst particles are titanium oxide ($TiO_2$) particles.

3. A cutting apparatus comprising:
   a chuck table for holding a semiconductor wafer;
   cutting means having a cutting blade for cutting said semiconductor wafer held on said chuck table, said cutting blade having a cutting edge containing photocatalyst particles; and
   a cutting water nozzle for supplying a cutting water to said cutting blade;
   said cutting means including a spindle, said cutting blade detachably mounted on a front end portion of said spindle, and light applying means for applying light for exciting said photocatalyst particles;
   whereby when said light for exciting said photocatalyst particles is applied from said light applying means to said cutting edge of said cutting blade, said cutting water supplied from said cutting water nozzle to said cutting blade is given an oxidizing power due to hydroxy radicals.

4. The cutting apparatus according to claim 3, wherein said photocatalyst particles are titanium oxide (TiO$_2$) particles.

\* \* \* \* \*